United States Patent
Strachan et al.

(10) Patent No.: US 11,462,268 B1
(45) Date of Patent: Oct. 4, 2022

(54) GENERATING HASH CODES FOR LOCALITY SENSITIVE HASHING

(71) Applicant: Hewlett Packard Enterprise Development LP, Houston, TX (US)

(72) Inventors: John Paul Strachan, San Carlos, CA (US); Can Li, Palo Alto, CA (US); Catherine Graves, Milpitas, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 17/245,115

(22) Filed: Apr. 30, 2021

(51) Int. Cl.
G11C 11/00 (2006.01)
G11C 13/00 (2006.01)
H03K 5/24 (2006.01)

(52) U.S. Cl.
CPC ........ *G11C 13/0059* (2013.01); *G11C 13/004* (2013.01); *G11C 13/0026* (2013.01); *G11C 13/0028* (2013.01); *G11C 13/0069* (2013.01); *H03K 5/2481* (2013.01)

(58) Field of Classification Search
CPC ............ G11C 13/0059; G11C 13/0026; G11C 13/0028; G11C 13/004; G11C 13/0069
See application file for complete search history.

(56) References Cited

U.S. PATENT DOCUMENTS

| | | | |
|---|---|---|---|
| 9,177,388 B2 | 11/2015 | Tonisson et al. | |
| 9,183,173 B2 | 11/2015 | Yih et al. | |
| 10,049,305 B2 | 8/2018 | Vijayanarasimhan et al. | |
| 10,885,098 B2 | 1/2021 | Drake et al. | |
| 2017/0228345 A1* | 8/2017 | Gupta | G06F 17/141 |
| 2021/0142846 A1* | 5/2021 | Lenjani | G11C 7/1006 |
| 2021/0390382 A1* | 12/2021 | Kwon | H03M 1/12 |

OTHER PUBLICATIONS

Hari, S., "Locality Sensitive Hashing for Similar Item Search," Jul. 5, 2018, 11 pages, https://towardsdatascience.com/locality-sensitive-hashing-for-music-search-f2f1940ace23.

Imani, M. et al., "DUAL: Acceleration of Clustering Algorithms using Digital-based Processing in-Memory," 2020 53rd Annual IEEEE/ACM Int'l Symposium on Microarchitecture (MiCRO), 2020, 16 Pgs. https://acsweb.ucsd.edu/~sag076/papers/micro20_dual.pdf.

* cited by examiner

*Primary Examiner* — Hien N Nguyen
(74) *Attorney, Agent, or Firm* — Hewlett Packard Enterprise Patent Department

(57) ABSTRACT

Examples disclosed herein relate to digital hash code generation. A digital hash code generating device comprising a plurality of variable conductance elements. Each variable conductance element is coupled to a selected row line and to a selected column line of a crossbar array. Each variable conductance element comprises a conductance from a stochastic distribution of conductance. A plurality of comparator elements and each comparator element is connected to a set of at least two column lines. The plurality of comparator elements generates a hash code in response to a vector input applied to the plurality of row lines of the crossbar array.

20 Claims, 7 Drawing Sheets

GENERATING HASH CODES FOR LOCALITY SENSITIVE HASHING

BACKGROUND

With the digital revolution, there is massive adoption and proliferation of digital devices and consequentially, this has resulted in ease of generation of records. Huge volumes of data are generated every moment. Typically, searching and indexing huge volumes of data, such as images, text data, etc. can be time-consuming and challenging. Certain techniques such as Locality Sensitive Hashing (LSH) may be used for this purpose. LSH is capable of hashing inputs in such a way that similar items are more likely to he hashed to same bucket than dissimilar items.

BRIEF DESCRIPTION OF DRAWINGS

The present subject matter can be best understood by referring to the following description and the accompanying drawings that are used to illustrate examples of the present subject matter.

DETAILED DESCRIPTION

Figure 1:
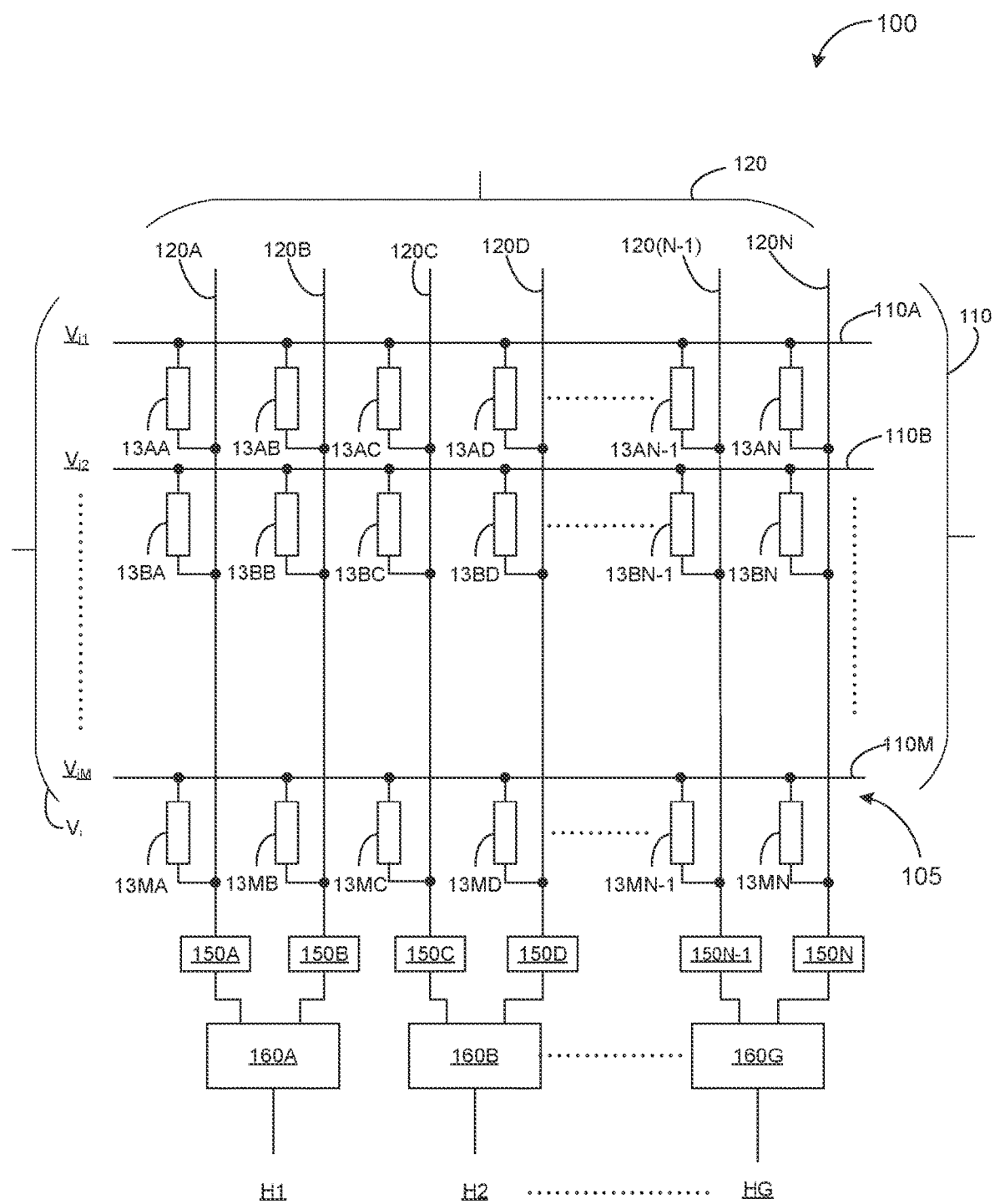
FIG. 1 illustrates a schematic view of a digital hash code generating device, according to an example of the present subject matter.

Generally, hashing/hash function is a technique used to map data to fixed-size values. These fixed-size values are referred to as hash codes. The hash codes along with hash tables can be used to bucket data and to retrieve data. LSH is a hashing technique capable of hashing inputs in such a way that similar items (inputs) are more likely to be hashed to same bucket than dissimilar items. In other words, inputs that have a small distance between each other in an input space are also close to each other in an output space after hashing. The LSH technique can be used in data clustering, nearest neighbor search, attention-based machine learning, etc.

The LSH technique can be implemented in many ways. One popular way of implementing the LSH technique is by random projection. The random projection uses random hyperplanes to hash inputs/vector inputs. In order to decide which side of a hyper plane the vector inputs lie, a method involving the generation of random vectors with a norm unit (hyperplanes) and multiplication of vector inputs with the random vectors is performed. However, implementing such a technique on conventional digital hardware or using software is a challenge, owing to complexity in random vector generation and vector-matrix multiplications. For example, vector input may have to be normalized and a random matrix has to be generated, and then the vector-matrix multiplication is to be performed. The technique is computationally expensive to be implemented in conventionally available devices.

Thus, the present subject matter addresses the aforementioned technical shortcomings. Examples described herein, in relation to the present subject matter, relate to system and/or method for LSH, which may be implementable on in-memory analog hardware.

In some examples, a digital hash code generating (DHG) device is provided for LSH. The DHG device comprises a crossbar array comprising a plurality variable conductance elements. In some examples, each variable conductance element comprises a conductance value stochastically determined from a probability distribution, such as a Gaussian distribution. The DHG device comprises a plurality of comparator elements functionally connected to the crossbar array. In response to a vector input applied to a crossbar array, the plurality of comparator elements generates a hash code.

In some examples, the DHG device relates to a random projection-type LSH. Hash codes are generated by the dot product of input vectors with hyperplane vectors. Random vectors with a norm unit (i.e., hyperplane vectors) are generated by the crossbar array with the plurality of variable conductance elements. The dot product of the input vectors with the hyperplane vectors determines which side of hyperplane the input vector lies, in order to generate the hash code. The present subject matter exhibits a significant reduction in energy required to perform the LSH operation when compared to a conventional hardware processor thereby making it power efficient.

The DHG device may be realized on analog hardware and is capable of producing digital hash codes for searching or indexing vector inputs. The DHG device reduces the computational time required for LSH when performed on a digital processor. The DHG device generates the hash codes with high parallelism. Due to high parallelism, the power consumption is low—as the operational time is less thereby making it a power-efficient device.

The DHG device is compatible with any precursor or postcursor systems for performing further processing, like linear algebraic operations (e.g., neural networks or signal processing), which can be implemented with in-memory analog hardware/computing substrate, von-Neumann hardware, etc. The precursor or postcursor devices include a content-addressable memory (CAM) (binary, ternary, or analog), a dot-product device for vector-matrix operations, analog sensors, etc. The search or indexing query is implemented in a shorter time (when compared to digital processing) or even in constant time, using a small memory footprint, and with reliable output. The DHG device can be used in areas such as data clustering, nearest neighbor searching, attention-based machine learning, etc.

Throughout the drawings, certain features and components may be exaggerated in their schematic form, and certain details of few elements may not be shown, for brevity, and not by way of limitation.

Further, the following description refers to the examples illustrated in the accompanying drawings. Wherever possible, identical reference signs are used in the drawings and in the following description, to refer to the same or similar features. While several examples are described in the description, many modifications, adaptations, and other implementations are possible. The following examples do not limit the scope of the present subject matter.

As used herein, unless otherwise specified, the use of the terms "first", "second", "one", "other", "another" etc., to describe any element, merely indicates that different instances of similar elements being referred to, and are not intended to imply that the elements so described must be in a given sequence, either temporally, spatially, in ranking, or any other manner.

FIG. 1 illustrates a schematic view of an example digital hash code generating device 100. The digital hash code generating (DHG) device 100 comprises a crossbar array 105 comprising a plurality of row lines 110A-110N and a plurality of column lines 120A-120M. In the illustrated example, there are M parallel row and there are N parallel column lines. As the name indicates, the row lines cross the column lines.

In one example, each row line of the plurality of row lines 110A-110N (collectively, referred to as '110') and each column line of the plurality of column lines 120A-120M (collectively referred to as '120') may be conductors that carry current. The DHG device 100 comprises a plurality of variable conductance elements 13AA-13MN. Each variable conductance element connects to a selected row and column lines. For example, a variable conductance element 13AA may have two terminals and is connected between row line 110A and column line 120A. Similarly, another variable conductance element 13AB is connected between row line 110A and column line 120B.

Further, the plurality of variable conductance elements 13AA-13MN have conductance stochastically determined from a probability distribution. The variable conductance element can be a non-volatile type resistive element that includes, but is not limited to a resistive memory element, a phase change memory element, Magnetoresistive random-access memory (MRAM), any other non-volatile memory (NVM), or any other resistive element. In some examples, variable conductance elements exhibit an intrinsically stochastic distribution of resistance/conductance. Intrinsic stochasticity of variable conductance elements with quick switching event acts as a random source, which contrasts a pseudo-random number generation required when implementing LSH on digital hardware/processors. In further examples, the crossbar array may be programmed using a random matrix defined remotely from the DHG device.

The vector input $V_i$ may be an analog signal. For example, drivers may be connected to the row lines and an address decoder may be used to select a row line and activate the driver corresponding to the selected row line. The driver for a selected row line can drive a corresponding row line with different voltages corresponding to the input vector. In one example, the vector input is an array of binary signals that are first applied to a digital to analog converter and the analog output is applied to the DHG device. Application of the vector input $V_i$ causes current to flow through the variable conductance element. The current is equal to a product of vector input $V_i$ ($V_{i1}$, $V_{i2}$ . . . , or $V_{iM}$) and conductance of respective variable conductance elements. The total current flowing through each column line is equal to a sum of currents flowing through each variable conductance element in a column line (based on Kirchhoff's Current Law). Vector input is weighted by conductance, with random distribution, of the variable conductance element.

To obtain an output voltage at each column line, a converter element is provided for each column line for current to voltage conversion. In the illustrated example, a plurality of converter elements 150A-150M is provided. For example, converter element 150A is connected to column line 111A to convert the current flowing across column line 11A to a voltage. Further, the DHG device 100 comprises a plurality of comparator elements 160A-160G (collectively referred by '160'). Each comparator element of the plurality of comparator elements 160 is functionally connected to a set of at least two selected column lines. The phrase 'functionally connected' indicates it may be a direct connection, an indirect connection, or a connection through one or more intermediate elements. In the illustrated example, each column line of the set of at least two column lines is connected to a converter element, and then through the converter elements, the column lines are connected to the comparator elements. In one example, each converter element is a current to voltage converter. In another example, each column line is coupled to a converter element, and at least one converter element (out of the set of at least two converter elements) is coupled to two or more comparator elements of the plurality of comparator elements. In the illustrated, a pair of adjacently disposed column lines (set of two column lines) 120A, 120B, are coupled to a comparator element 160A. The output of each comparator element is a digital hash code.

Considering the example of random projection that uses hashing planes for hashing of vector input $V_i$, the hashing plane may be represented by two-column lines of the crossbar array, as per one example. Each colon line may be a random vector in the same dimensional space as that of the vector input $V_i$. An equivalent of random rotation of hashing planes and projection of vector input $V_i$ is achieved by the dot product of vector input $V_i$ with the random vectors (random distribution of conductance) from the column lines of DHG device 100. The crossbar array 105 enables dot product between the vector input $V_i$ and the random vectors. In some examples, a single column line may also represent the hashing plane. However, the hashing plane representation by two-column lines may be considered, in some examples. The dot product of vector input with the random vector from each column line (conductance) projects the vector input from X-dimensional space to a Y-dimensional space (Y being smaller than X). Based on the projection values (dot product) of the set of two column lines, the comparator element that is functionally coupled to the two column lines, generates a digital hash code, without any overhead of digital to analog conversion circuitry. Moreover, the two-column line each exhibits a random vector close to Gaussian distribution and the difference between the two column lines is also random close to Gaussian distribution.

Each of the variable conductance elements has a conductance stochastically determined from a probability distribution of conductance and the difference between conductance of any two variable conductance elements is also stochastic. In one example, the probability distribution of conductance is kept close to the Gaussian distribution. The output of the DHG device 100 is the digital hash codes $H_1$-$H_G$, which are in the Y-dimensional space and the Y-dimensional space is smaller than the X-dimensional space. Further, the hash codes $H_O$ map similar vector inputs into the same buckets with a high probability. Further, the DHG device 100 generates the hash code $H_1$-$H_G$ in a single operational step. In other words, the DHG device generates the hash code $H_O$ in response to the vector input $V_i$ applied to the row lines with high parallelism.

Figure 2:
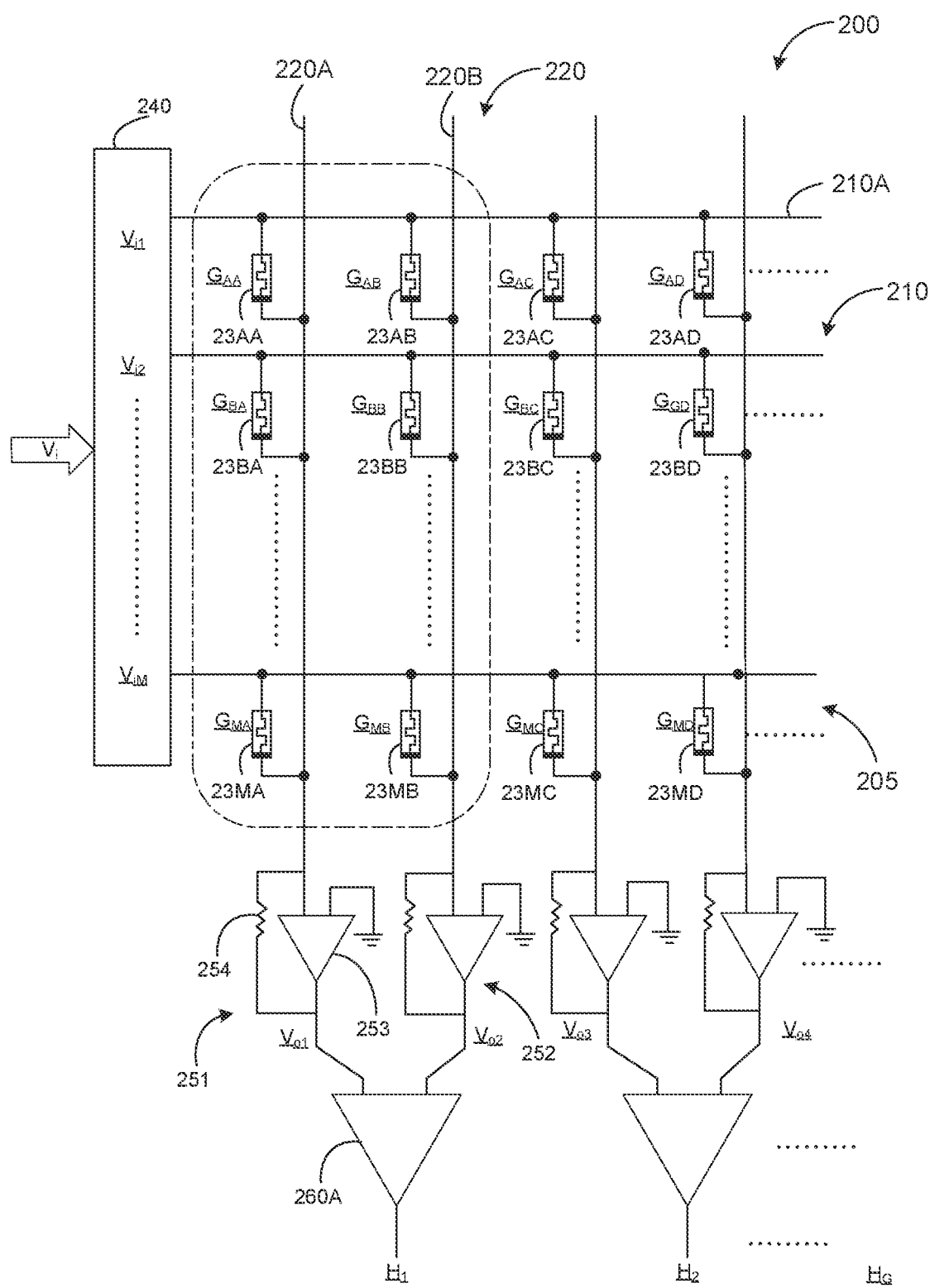
FIG. 2 depicts a schematic circuit level view of a digital hash code generating device, according to another example of the present subject matter.

FIG. 2 illustrates a schematic circuit level view of an example digital hash code generating device 200. The DHG device 200 comprises a crossbar array 205 comprising a plurality of row lines 210 and a plurality of column lines 220. The DHG device 200 comprises a plurality of memristors 230 acting as the variable conductance elements. For example, a memristor 23AA is connected between row line 210A and column line 220A. The plurality of memristors 230 may further include electronic elements like transistors, resistors, etc. For ease of representation, only memristors are depicted, but not by way of limitation. The DHG device 200 performs locality-sensitive hashing by generating digital hash codes faster than a software application running on a general-purpose processing device.

A vector input $V_i$ is applied as input to the DHG device 200. The vector input may be signals applied in the form of voltages to the plurality of row lines 210. In one example, the vector input $V_i$ is applied simultaneously to the plurality of row lines 210 in the form of voltage signals $V_i$. In some examples, the vector input may be voltages that are continuously distributed. The application of voltage signals causes current to flow in the plurality of column lines 220. For example, a current flowing through a selected column line is the result of a sum of all the currents flowing through the memristors across the selected column line, due to the application of voltage signals $V_{i1}$-$V_{iM}$ as the vector input (collectively referred by '$V_i$').

Further, each column line is connected to a converter element. For brevity, only two converter elements are marked i,e., 251, 252. The converter element may act as sense circuitry for converting an electrical current from each column line to a voltage signal. In one example, each column line is connected to a converter element (say, a current to voltage converter). A set of at least two converter elements is connected to a selected comparator element. For example, the set of at least two converter elements 251, 252 is connected to a selected comparator element 260A. Further, in the current example, the set of at least two converter elements 251, 252 is unique to the selected comparator element 260A. In other words, the selected comparator element 260A receives inputs from a unique set of two converter elements 251, 252, and these two converter elements 251, 252 may not be connected to any other comparator element, as per one example. Similarly, another set of two converter units is connected to another selected comparator element. In one example, the converter element 251 may include an operational amplifier 253 and a resistor 254 that is arranged to provide a virtual ground circuit. In a further example, a converter element 251, 252 (only one marked for brevity) may include a trans-impedance amplifier (TIA) or any other current to voltage converter.

In one example, a driver element 240 is provided at the input of the DHG device 200. The driver element 240 may convert and apply vector input as analog voltages to the plurality of row lines 210. In some examples, the driver element 240 may normalize the vector input before applying it to the plurality of row lines 210. Upon applying the voltage signals $V_i$ the output at the converter elements would be an output voltage signal $V_0$.

$$V_0 = V_i \times G \times R_s$$

$R_s$ may be feedback resistance and G is a random conductance matrix representing conductance of the plurality of memristors in the DHG device 200. For example, $G_{AA}$ is the conductance of memristor 23AA. In one example, the memristors are configured to have conductance with a random distribution. In one example, the random distribution is configured to be close to Gaussian distribution and the random conductance matrix G may comprise identically and independently distributed Gaussian entries representing a random rotation of hashing planes as required in cross-polytope LSH. For obtaining random rotation, the vector input $V_i$ is multiplied with the random conductance matrix G. In other words, random rotations on a unit sphere (with reference to cross-polytope LSH) are implemented by multiplying the vector input $V_i$ with the conductance matrix. Further, each hashing plane is represented by the two-column lines of memristors, as per the illustrated example. A difference between the distribution of the conductance of two memristors is also Gaussian. The output of a plurality of comparator elements (voltage comparison between the two column lines of memristors) is a digital signal, which is the hash code $H_0$. In some examples, each comparator element, of the plurality of comparator elements, is functionally connected to a set of at least two column lines. For example, Comparator element 260A is functionally connected to the set of at least two column lines 220A, 220B, as per the illustrated example. In one example, the comparator element is a voltage comparator element, which provides an output voltage (low or high) based on the inputs applied.

Further, the crossbar array 205 is configured to provide a random conductance distribution close to Gaussian distribution. In one example, a target conductance matrix is pre-defined for a use case or application and the crossbar array is programmed iteratively until the target conductance matrix is achieved. A hardware processor may execute the instruction(s) to alter the conductance according to a stochastically determined probability distribution. Any sort of probability distribution may be employed.

In another example, fabricated pristine memristors may be used, which offers the random distribution of conductance. The memristors exhibit stochasticity of conductance due to variations in production or manufacturing, which is used for random distribution of conductance in the crossbar array.

In yet another example, the natural stochastic nature of the conductance switching event of memristors is utilized. Further, one-shot voltage pulse targeting a target conductance value (e.g., $G_{target}$ as shown in FIG. 4—discussed in detail later on) may be performed. The voltage pulse causes the conductance distribution of the memristors to attain a random distribution, which is near Gaussian distribution about the target conductance value. An example method of tuning conductance is discussed in FIGS. 3A and 3B.

When an input voltage signal is applied to the DHG device 200, a sampling of conductance may he done from different parts of the conductance distribution thereby providing randomness. Further, currents flowing through each memristor indicate a multiplication of conductance (random value) of the memristor with the vector input. The sum of currents flowing across a selected column indicates the summation of the products (product here is of conductance and voltage), thereby providing accelerated matrix multiplication. The current from each of the column lines is converted to a voltage by the converter elements. Voltage from two selected column lines is compared, by using a comparator element, to get a digital output (either a positive pulse or a negative pulse with pre-set amplitude). The DHG device 200 provides digital hash codes with ease, eliminating overhead that may he caused for digital to analog conversion on a computing device. The digital hash codes generating device 200 offers accelerated matrix multiplication of the vector input and the random conductance matrix G, which is a random matrix close to a Gaussian distribution.

Figure 3A:
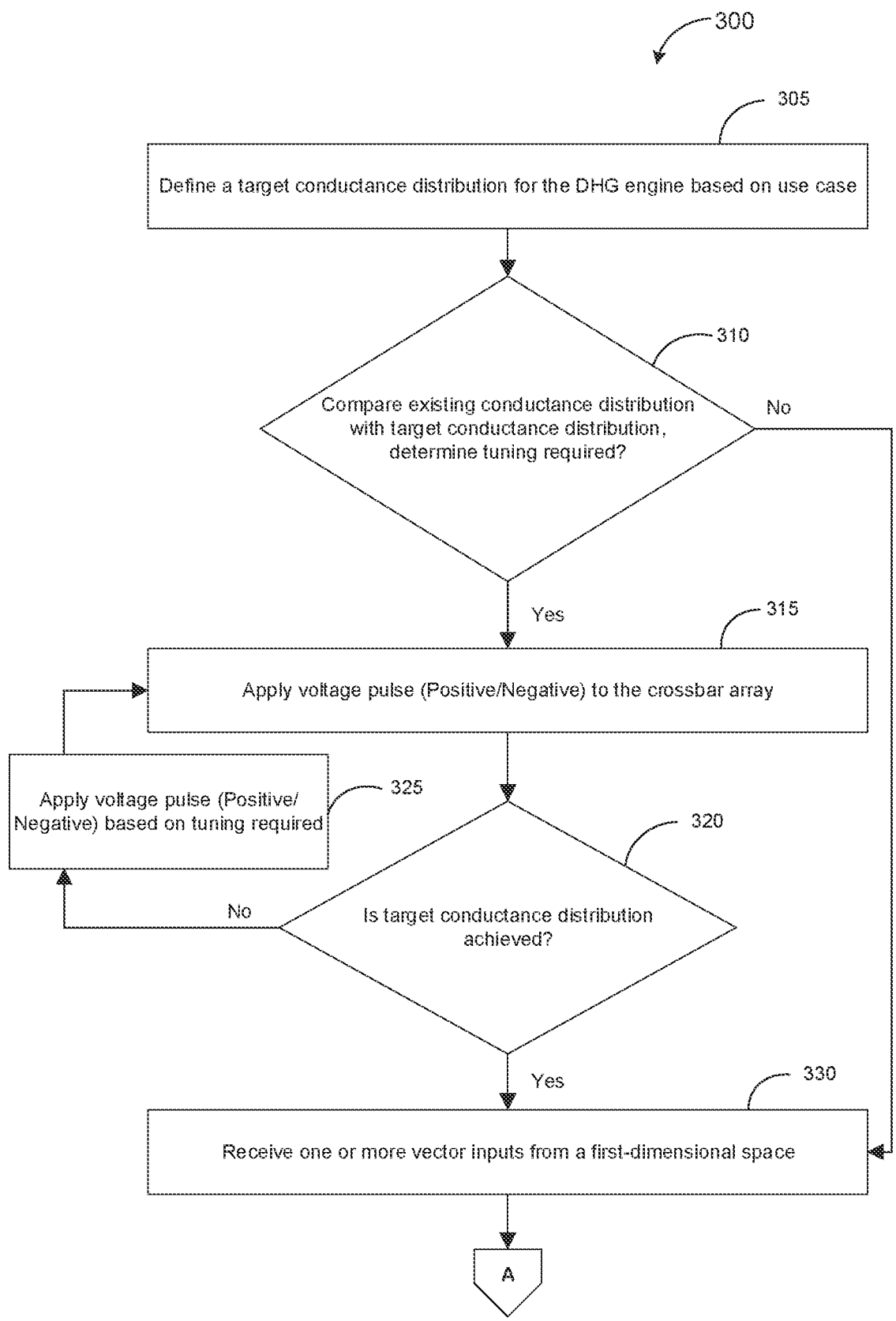
FIGS. 3A and 3B depict a flow diagram illustrating a method of operation of the digital hash code generating device, in accordance with an example of the present subject matter.
Figure 3B:
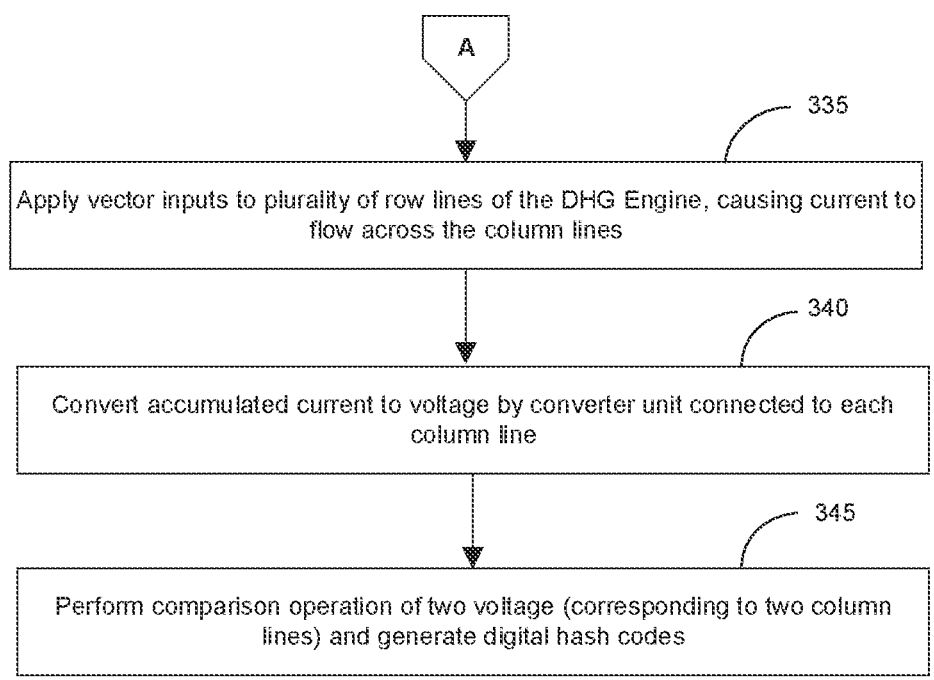
Figure 4:
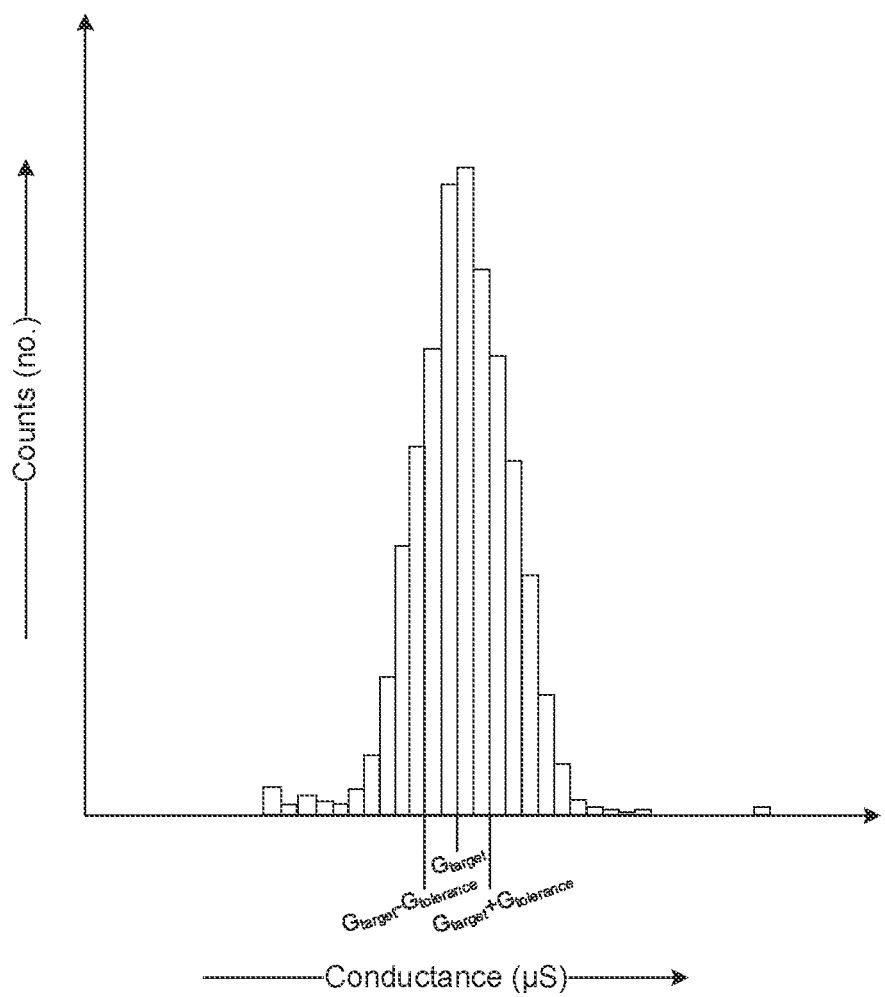
FIG. 4 illustrates a schematic graph depicting conductance distribution, in accordance with an example of the present subject matter.

FIGS. 3A and 3B illustrate a flow diagram 300 depicting an example method of operation of a digital hash code generating device. The method includes two portions—tuning of the DHG device to achieve the desired conductance distribution & analog computation across the DHG device for LSH. The various blocks illustrated in the flow diagram 300 may correspond to various instructions on a non-transitory storage medium of a computing device. The computing device may include a processing element capable of retrieving, decoding, and executing the instructions from the non-transitory storage medium, which is a computer-readable type. As an alternative or in addition to retrieving and executing instructions, a processing element may include at least one integrated circuit (IC), other control logic, other electronic circuits, or combinations thereof that include a number of electronic components for performing the functionality of instructions herein.

For ease of discussion, the blocks or instructions are discussed in sequential order, but not by way of limitation. In some examples, only a few blocks or selected instructions may be executed. In some other examples, the instructions may be executed in parallel to accelerate operation and to reduce execution time. The term 'processing element' maybe, one or multiple central processing units (CPU), one or multiple semiconductor-based microprocessors, one or multiple graphics processing units (GPU), other hardware devices suitable for retrieval and execution of instructions stored in a machine-readable storage medium, or combinations thereof. The processing element can be a physical device. Moreover, in one example, the processing element may include multiple cores on a chip, include multiple cores across multiple chips, multiple cores across multiple devices (e.g., if the computing device includes multiple node devices), or combinations thereof.

At 305, target conductance value (e.g., and target tolerance value are defined for the DHG device to achieve a target conductance distribution. Users may define the target conductance value and the target tolerance. In some examples, a target conductance value may be selected by the computing device based on a use case or application.

At 310, an existing conductance distribution of the DHG device may be compared with the target conductance distribution to determine if tuning is required. In some examples, the conductance of the plurality of variable conductance devices may be checked if they are having a probability distribution close to a Gaussian distribution. FIG. 4 illustrates a schematic view of an example conductance distribution. The conductance is represented against counts. A target conductance value $G_{target}$ is defined and the memristors may be tuned/programmed to achieve the target conductance i.e., a mean value of conductance distribution is tuned to match or at least be close to target conductance value $G_{target}$.

In some examples, a tolerance conductance value $G_{tolerance}$ is also defined. Conductance distribution of memristors is tuned to achieve a conductance within $G_{target}$+/−$G_{tolerance}$. Further, due to the stochasticity of switching events exhibited by the memristors, the final conductance distribution is close to a Gaussian distribution, with the mean close to the target conductance value $G_{target}$, and a standard deviation set by the tolerance conductance value $G_{tolerance}$. In some examples, a one-shot programming may be performed targeting the target conductance value $G_{target}$ to obtain the target conductance distribution. Due to the stochastic nature of the conductance switching event of the memristors, application of one-shot voltage pulse, the memristors attain a random distribution of conductance about the target conductance value $G_{target}$.

In some further examples, upon one-shot programming, if a set of variable conductance elements exhibit conductance outside the tolerance conductance value $G_{tolerance}$ from the $G_{target}$, one or more additional pulses may be triggered (iterative programming) to obtain conductance values within the tolerance conductance value $G_{tolerance}$. This is iterated till the conductance of all variable conductance devices falls within the tolerance conductance value $G_{tolerance}$ thereby obtaining a random Gaussian distribution of conductance. The method may include obtaining the target conductance distribution from one-shot or iterative programming.

Random values can be generated by several or one-time memristor switching events. The stochastic distribution of conductance values provided by the memristors in the device avoids any expensive (in terms of processing time and/or hardware) steps such as pseudo-random number generation (PRNG) and data transfer from the PRNG for matrix-multiplication.

Continuing with the flow diagram 300, at 315, voltage pulses may be applied to the crossbar array to achieve the target conductance distribution and a desired width of the conductance distribution, as discussed earlier. In one example, voltage pulses are applied selectively or progressively towards achieving the target conductance distribution. If during application of the voltage pulses (positive), the conductance crosses a target conductance value then voltage pulses (negative, inverse) may be applied to reverse the conductance.

At 320, it is checked whether a target conductance distribution is achieved. If the target conductance distribution (i.e., random conductance distribution) is not achieved then at 325, the application of voltage pulses is iterated (iterative programming) such that the target conductance distribution is achieved for the selected use case. In some examples, the number of pulses (positive/negative) to be applied is predefined in a non-transitory storage medium or a look-up table. In another example, a progressiveness of the voltage pulses to be applied is defined in the non-transitory storage medium or another look-up table to yield the target conductance distribution that is close to (uniform) Gaussian distribution in the least number of iterations. The aforementioned blocks 305-320 may be executed or performed when the conductance distribution is to be tuned towards the target conductance distribution. The subsequent blocks correspond to analog computation for digital hash code generation.

At 330, the DHG device receives one or more vector inputs, which are from an X-dimensional space. In some examples, the vector input may be applied to a digital-to-analog, converter—when the input signals are digital. In some examples, the DHG device may be coupled to another precursor device or circuit that generates signals as part of a sensor output, which becomes the vector input for the hash code generating device. In further examples, the signals may be normalized at this stage.

At 335, the vector inputs are applied to the input of the DHG device. In some examples, the vector input may be simultaneously applied to the plurality of row lines of the DHG device. The application of vector input (voltages/voltage signals) may cause current to flow and an accumulated current flows across each column line in the plurality of column lines.

At 340, a sum of currents (accumulated current) across the column line is converted to a voltage by a converter element connected to each of the column lines. In some examples, the converter element may be current to voltage converting circuitry.

At 345, in one example, the comparator element receives converted voltage as input, from two converter elements. The comparator element performs a comparison operation between the voltages and provides a digital output. In some examples, the comparator element reduces the overhead imposed due to analog to digital conversion. The digital output from a plurality of comparator elements becomes a hash code corresponding to the vector input. In other words, the vector input in X-dimensional space is mapped or bucketed through the hash codes, which are in Y-dimensional space. The X-dimensional space is a higher-dimensional space than the Y-dimensional space. In some examples, the vector input from X-dimensional space can be documents, images, signals, or data as observed or recorded. In some examples, the Y-dimensional space can be a fixed length of bits [e.g., the digital hash output code length]. Even though blocks 330-345 are sequentially discussed for ease, corresponding actions during execution may occur with high parallelism.

Figure 5:
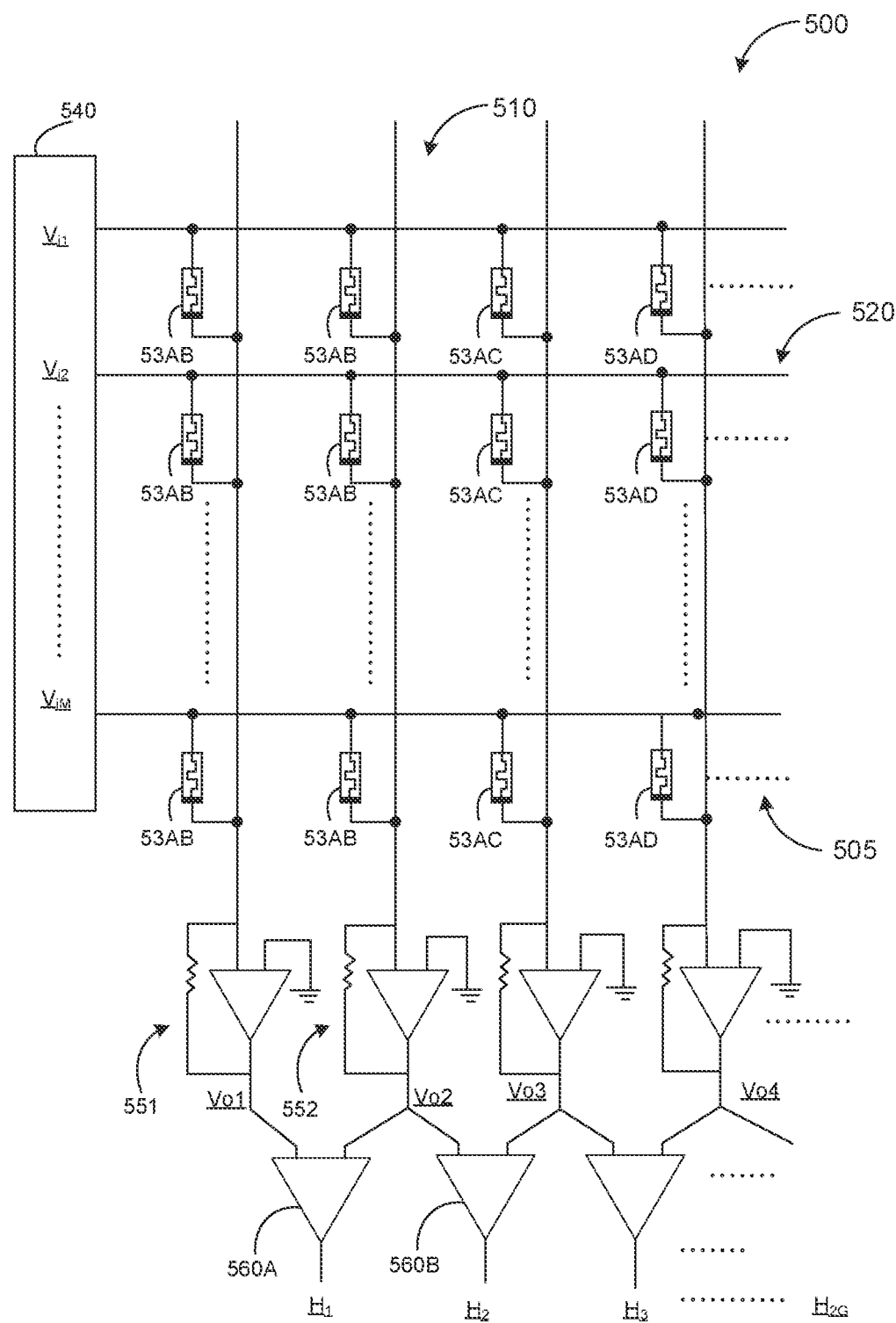
FIG. 5 depicts a schematic circuit level view of a digital hash code generating device, in accordance with yet another example of the present subject matter.

FIG. 5 illustrates a schematic circuit level view of an example DHG device. The DHG device 500 comprises a crossbar array 505 with a plurality of row lines 510 and a plurality of column lines 520. The crossbar array 505 comprises a plurality of memristors and each memristor is connected to a selected row and column lines. For example, memristor 53AA is connected to a selected row line and a selected column line. Application of vector input (analog voltages) causes current to flow in the column lines. Currents get accumulated in the column lines and the currents are converted to a voltage by a converter element. Reference numeral 551 denotes the converter element. In one example, voltage outputs of a first column line and a second column line are connected to one comparator element. Further, voltage outputs from a second column line and a third column line are connected to another comparator element. The outputs of the column line or the corresponding converter element (voltage) may be shared by one or more comparator elements. This sharing of the output voltages enables generating a larger hash code—because column conductance distributions are independent and random, and two-column lines can be combined to provide a longer random distribution. Accumulating over the two-column lines is equivalent to a random rotation with a larger hash plane.

Further, in an additional example, a first comparator element may receive voltages corresponding to first and second column lines. A second comparator element may receive voltages corresponding to first and third column lines. Instead of sharing voltage corresponding to adjacently disposed/neighbor column lines, any random combination of column lines may be selected as the independence between the voltages and randomness of conductance distribution still exists. In other words, the set of at least two converter elements 551, 552 (say, current to voltage converter) comprises at least one converter element 552 connected to two comparator elements 560A, 560B of the plurality of comparator elements, as per the illustrated example. Thus, at least one current to voltage converter is coupled to two or more comparator (elements such as voltage comparator elements. In other words, an output of one current to voltage converter may be fed as input to two or more comparator elements. The current example generates hash code, which is longer. For example, a length of hash code (H1, H2, . . . , H2G) is double, with reference to a length of hash code generated in the earlier example of FIG. 2.

Figure 6:
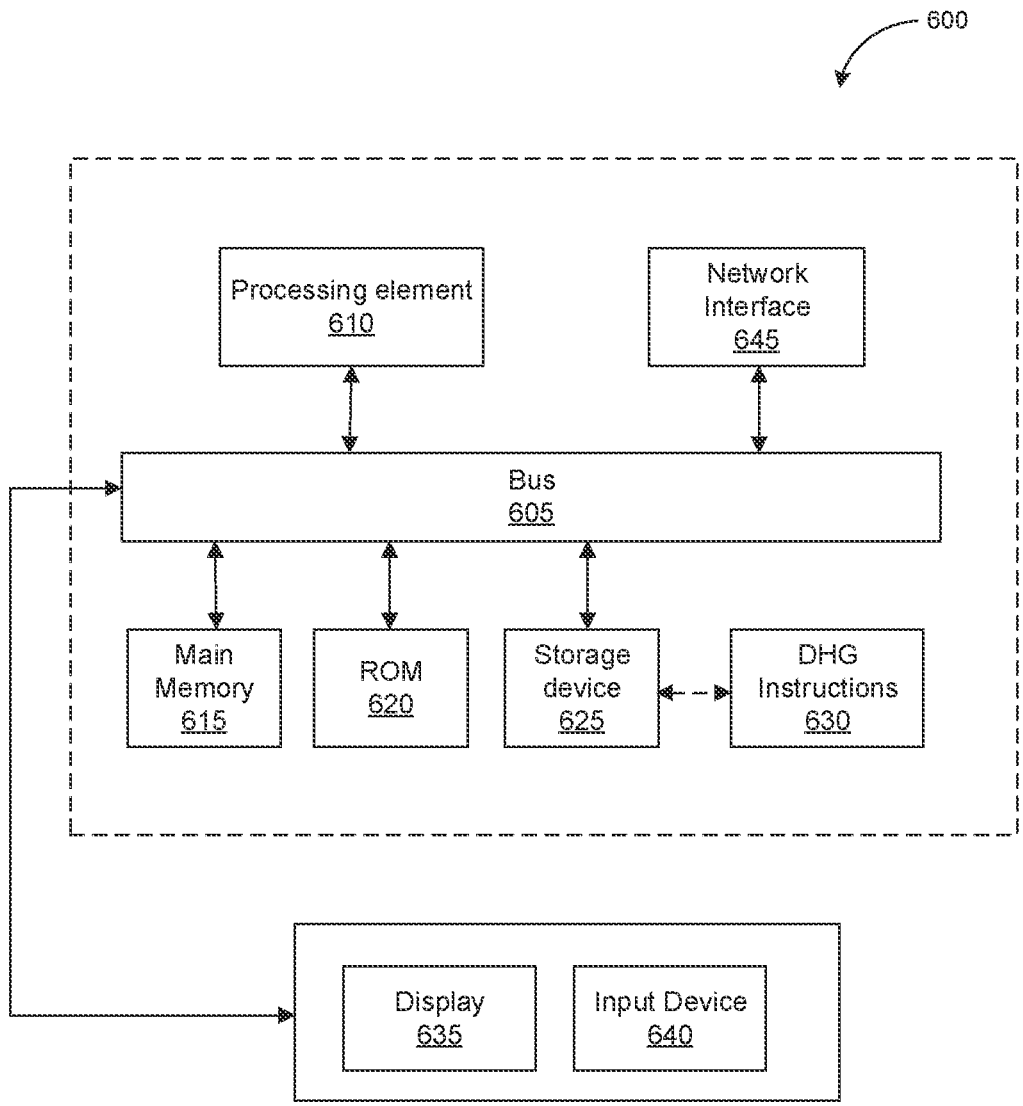
FIG. 6 illustrates a block diagram computer system, in accordance with an example of the present subject matter.

FIG. 6 illustrates a schematic block diagram of an example computer system in which the examples described herein may be implemented. The computer system 600 includes a bus 605 or other communication mechanisms for communicating information, one or more hardware processing elements 610 coupled with bus 605 for processing information. Hardware processing elements(s) 610 may be, for example, one or more general-purpose microprocessors.

Further, the computer system 600 includes a main memory 615, such as random-access memory (RAM), cache, and/or other dynamic storage devices, coupled to the bus 605 for storing information and instructions to be executed by the processing element 610. Main memory 615 also may be used for storing temporary variables or other intermediate information during the execution of instructions to be executed by processing element 610. In some examples, the main memory 615 is non-transitory type.

The computer system 600 further includes a read-only memory (ROM) 620 or other static storage device coupled to bus 605 for storing static information and instructions for processing element 610. A storage device 625, such as a magnetic disk, optical disk, or USB thumb drive (Flash drive), etc., is provided and coupled to bus 605 for storing information and instructions. In some examples, the computer system includes a DHG instruction 630 stored in the storage device 625. The storage device 625 may be a non-transitory storage medium.

The computer system 600 may be coupled via bus 605 to a display 635, for displaying information to a computer user. An input device 640, including alphanumeric and other keys, may be coupled to bus 605 for communicating information and command selections to processing element 610. Another type of user input device is cursor control, such as a mouse, a trackball, or cursor direction keys for communicating direction information and command selections to processing element 610 and for controlling cursor movement on the display 635. In some embodiments, the same direction information and command selections as cursor control may be implemented via receiving touches on a touch screen without a cursor.

The computer system 600 may implement the techniques described herein using customized hard-wired logic, one or more ASICs or FPGAs, firmware, and/or program logic which in combination with the computer system causes or programs computer system 600 to be a special-purpose machine. The computer system 600 also includes a network interface 645 coupled to bus 605. Network interface 645 provides two-way data communication on one or more networks. The computer system 600 can send messages and receive data, including program code, through a network interface 645.

The devices 100, 200, 500 include hardware and/or combinations of hardware and programming to perform functions provided herein. The terms—converter element or comparator element includes a circuit, module, and/or combination of circuit/modules and software. While certain examples have been shown and described above, various changes in form and details may be made. Certain features that have been described in relation to one example and/or method can be related to other examples. In other words, flow diagrams, methods, features, components, and/or properties described in relation to one example can be useful in other examples. Furthermore, it should be appreciated that the systems and methods described herein can include various combinations and/or sub-combinations of the components and/or features of the different examples described. Thus, features described with reference to one or more examples can be combined with other examples described herein.

We claim:
1. A digital hash code generating device comprising:
   a crossbar array comprising:
      a plurality of row lines, and
      a plurality of column lines;
   a plurality of variable conductance elements,
      wherein each variable conductance element, of the plurality of variable conductance elements, is coupled to a selected row line, of the plurality of row lines, and to a selected column line, of the plurality column lines,
      wherein each variable conductance element has a conductance from a stochastic distribution of conductance; and
   a plurality of comparator elements,
      wherein each comparator element, of the plurality of comparator elements, is functionally coupled to a set of at least two column lines, of the plurality of column lines, and the plurality of comparator elements generate a hash code, and the hash code is generated in response to a vector input, applied to the plurality of row lines.

2. The digital hash code generating device of claim 1, wherein each variable conductance element, of the plurality of conductance elements, includes a memristor, and the stochastic distribution of conductance is close to a Gaussian distribution.

3. The digital hash code generating device of claim 1, wherein the vector input includes any one of an analog signal and an array of binary signals.

4. The digital hash code generating device of claim 1, further comprises a driver element to normalize the vector input before applying to the plurality of row lines.

5. The digital hash code generating device of claim 1, wherein each column line, of the plurality of column lines, is coupled to a current to voltage converter, and wherein a set of at least two current to voltage converters is coupled to a selected comparator element, out of the plurality of comparator elements.

6. The digital hash code generating device of claim 5, wherein the set of at least two current to voltage converters is unique to the selected comparator element.

7. The digital hash code generating device of claim 5, wherein at least one current to voltage converter, out of the set of at least two current to voltage converters, is coupled to two or more comparator elements, of the plurality of comparator elements.

8. The digital hash code generating device of claim 1, wherein each comparator element of the plurality of comparator elements, is a voltage comparator element, and wherein an output of each comparator element of the plurality of comparator elements is a digital signal.

9. The digital hash code generating device of claim 1, wherein each variable conductance element includes non-volatile memory that is programmable to obtain a target conductance and a Gaussian distribution of conductance about the target conductance.

10. The digital hash code generating device of claim 1, wherein the vector input is received from a precursor device and the hash code, from the digital hash code generating device, is fed to a postcursor device for further processing.

11. A method comprising:
   receiving, by a plurality of row lines of a digital hash code generating device, a vector input;
   causing, by each variable conductance element of a plurality of variable conductance elements of the digital hash code generating device, a current to flow in response to received vector input,
      wherein each variable conductance element, of the plurality of variable conductance elements, is coupled to a selected row line of the plurality of row lines, and a selected column line, of a plurality of column lines of the digital hash code generating device, and
      wherein the plurality of variable conductance elements comprising a stochastic distribution of conductance;
   accumulating, by each column line, of the plurality of column lines, currents caused by a set of variable conductance elements, of the plurality of variable conductance elements, coupled to each column line;
   converting, by a converter element, of a plurality of converter elements of the digital hash code generating device, accumulated current across each column line into a voltage; and
   generating, by a plurality of comparator elements of the digital hash code generating device, a hash code in response to a comparison of a set of at least two converted voltages by a set of at least two comparator elements, of the plurality of comparator elements.

12. The method of claim 11, further comprising:
   converting, by a plurality of converter elements, an accumulated current, across each column line, of the plurality of column lines, to a voltage before applying to the plurality of comparator elements.

13. The method of claim 11, further comprising:
   obtaining, by a computer system, a target conductance distribution corresponding to the plurality of variable conductance elements by targeting a target conductance value through a one-shot programming.

14. The method of claim 13, further comprising:
   defining a tolerance conductance value and performing iterative programming to obtain a mean of the target conductance distribution close to the target conductance value and to obtain the target conductance within the tolerance conductance value from the target conductance value.

15. The method of claim 11, wherein each comparator element, of the plurality a comparator elements, provides a digital output, wherein the digital output is one of a positive pulse and a negative pulse.

16. A digital hash code generating device comprising:
   a crossbar array comprising:
      a plurality of row lines, and
      a plurality of column lines;
   a plurality of memristors,
      wherein each memristor, of the plurality of memristors, is coupled to a selected row line, of the plurality of row lines, and to a selected column line, of the plurality column lines,
      wherein each memristor has a conductance from a stochastic distribution of conductance; and
   a plurality of voltage comparator elements,
      wherein each voltage comparator element, of the plurality of voltage comparator elements, is coupled to a set of at least two column lines, of the plurality of column lines, and the plurality of voltage comparator elements generate a hash code, and the hash code is generated in response to a vector input, applied to the plurality of row lines.

17. The digital hash code generating device of claim 16, wherein a conductance matrix corresponds to the plurality of memristors, and wherein the conductance matrix is close to Gaussian distribution.

18. The digital hash code generating device of claim 16, wherein each column line, of the plurality of column lines, is coupled to a converter element, and wherein the set of at least two column lines is coupled to set of at least two converter elements.

19. The digital hash code generating device of claim 18, wherein the set of at least two converter elements, coupled to a selected comparator element, is unique to the selected comparator element.

20. The digital hash code generating device of claim 18, wherein at least one converter element, out of the set of at least two converter elements, is coupled to two or more voltage comparator elements, out of the plurality of voltage comparator elements.

* * * * *